(12) United States Patent
Zhou et al.

(10) Patent No.: US 9,356,773 B2
(45) Date of Patent: May 31, 2016

(54) TIME-TO-DIGITAL CONVERTER, ALL DIGITAL PHASE LOCKED LOOP CIRCUIT, AND METHOD

(71) Applicant: Huawei Technologies Co., Ltd., Shenzhen (CN)

(72) Inventors: Shenghua Zhou, Shenzhen (CN); Xiaoyu Li, Shenzhen (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 0 days.

(21) Appl. No.: 14/700,832

(22) Filed: Apr. 30, 2015

(65) Prior Publication Data

US 2015/0318981 A1    Nov. 5, 2015

(30) Foreign Application Priority Data

Apr. 30, 2014   (CN) .......................... 2014 1 0182088

(51) Int. Cl.
*H03D 3/24* (2006.01)
*H04L 7/033* (2006.01)
*H04L 7/00* (2006.01)
*G04F 10/00* (2006.01)
*H03L 7/085* (2006.01)

(52) U.S. Cl.
CPC ............ *H04L 7/0331* (2013.01); *G04F 10/005* (2013.01); *H03L 7/085* (2013.01); *H04L 7/0025* (2013.01)

(58) Field of Classification Search
CPC .................................................... H04L 7/0331
USPC ........................................................ 375/376
See application file for complete search history.

(56) References Cited

U.S. PATENT DOCUMENTS

| | | | |
|---|---|---|---|
| 7,162,002 B2 | 1/2007 | Chen et al. | |
| 2003/0006817 A1* | 1/2003 | Seo | H03K 5/13 327/276 |
| 2009/0296532 A1* | 12/2009 | Hsieh | G04F 10/005 368/120 |
| 2012/0062296 A1 | 3/2012 | Miyashita | |
| 2014/0266354 A1* | 9/2014 | Boo | H03L 7/08 327/159 |

OTHER PUBLICATIONS

Roberts et al., "A Brief Introduction to Time-to-Digital and Digital-to-Time Converters," IEEE Transactions on Circuits and Systems-II: Express Briefs, vol. 57, No. 3, Institute of Electrical and Electronics Engineers, New York, New York (Mar. 2010).
Zanuso et al., "A 3MHz-BW 3.6GHz Digital Fractional-N PLL with Sub-Gate-Delay TDC, Phase-Interpolation Divider, and Digital Mismatch Cancellation," IEEE International Solid-state Circuits Conference Digest of Technical Papers, pp. 476-477, Institute of Electrical and Electronics Engineers, New York, New York (Feb. 10, 2010).
Kratyuk et al., "A Digital PLL With a Stochastic Time-to-Digital Converter," IEEE Transactions on Circuits and Systems I: Regular Papers, vol. 56, Issue 8, pp. 1612-1621, Institute of Electrical and Electronics Engineers, New York, New York (Aug. 2009).

* cited by examiner

*Primary Examiner* — Lihong Yu
(74) *Attorney, Agent, or Firm* — Leydig, Voit & Mayer, Ltd.

(57) ABSTRACT

The present invention discloses a time-to-digital converter. The time-to-digital converter includes: a phase interpolation circuit and a time-to-digital conversion circuit. The phase interpolation circuit is configured to receive a first reference clock signal and a second reference clock signal; perform phase interpolation on the first reference clock signal and the second reference clock signal to generate a third reference clock signal; and output the third reference clock signal to the time-to-digital conversion circuit. The time-to-digital conversion circuit is configured to receive the third reference clock signal and a fourth clock signal, where a phase difference between the third reference clock signal and the fourth clock signal is less than a phase difference between the first reference clock signal and the fourth clock signal; measure the phase difference between the third reference clock signal and the fourth clock signal; and convert the measured phase difference into a digital signal for outputting.

17 Claims, 5 Drawing Sheets

<Prior Art>

TIME-TO-DIGITAL CONVERTER, ALL DIGITAL PHASE LOCKED LOOP CIRCUIT, AND METHOD

CROSS-REFERENCE TO RELATED APPLICATION

This application claims priority to Chinese Patent Application No. 201410182088.3, filed on Apr. 30, 2014, which is hereby incorporated by reference in its entirety.

TECHNICAL FIELD

The present invention relates to the field of electricity, and in particular, to a time-to-digital converter, an all digital phase locked loop circuit, and a method.

BACKGROUND

A time-to-digital converter is mainly applied in an all digital phase locked loop circuit, and a function of the time-to-digital converter is to measure a phase difference between two clock signals and convert the phase difference into a digital signal. As shown in FIG. 1, a time-to-digital converter includes a delay circuit 101 and a determining circuit 102. The delay circuit 101 is configured to input two clock signals, which are an external reference clock signal FREF and a feedback clock signal CKV, delay the two clock signals, and after being triggered by a trigger in the determining circuit 102, obtain a quantized time interval between the two clock signals. The delay circuit 101 may consist of cursor delay links, and the cursor delay links include a first delay link and a second delay link. A time for which a delay may last when the FREF passes through a delay unit in the first delay link is $\tau_1$, and a time for which a delay may last when the CKV passes through a delay unit in the second delay link is $\tau_2$, where $\tau_1 > \tau_2$. When the FREF is transmitted in the first delay link and the CKV is transmitted in the second delay link, each time the two clock signals pass through one delay unit, a time difference between the two clock signals increases by $T_R$, where $T_R = (\tau_1 - \tau_2)$, and the time difference $T_R$ is time accuracy. Assuming that an output sequence Q changes from 1 to 0 after the clock signals pass through N stages of delay units, where N is an integer greater than 0, and the sequence $Q=[Q_1, Q_2, Q_3, \ldots, Q_L]$, it indicates that a measurement time difference between rising edges of the two signals is $N \cdot T_R$. ThFREFore, when the time accuracy is determined, a greater measurement time difference between the FREF signal and the CKV signal indicates a greater N, that is, more delay units are needed. As a result, a problem existing in the prior art is that: when the measurement time difference between the FREF signal and the CKV signal is great, more delay units are needed to ensure certain time accuracy, thereby increasing a circuit scale.

SUMMARY

An objective of the present invention is to provide a time-to-digital converter. With the time-to-digital converter, time accuracy can be ensured and the number of delay units used in a time-to-digital conversion circuit can be reduced.

A first aspect of the present invention provides a time-to-digital converter, including: a phase interpolation circuit and a time-to-digital conversion circuit connected to the phase interpolation circuit, where the phase interpolation circuit is configured to receive a first reference clock signal and a second reference clock signal, where a phase of the first reference clock signal is prior to a phase of the second reference clock signal; perform phase interpolation on the first reference clock signal and the second reference clock signal to generate a third reference clock signal; and output the third reference clock signal to the time-to-digital conversion circuit; and the time-to-digital conversion circuit is configured to receive the third reference clock signal and a fourth clock signal, where a phase difference between the third reference clock signal and the fourth clock signal is less than a phase difference between the first reference clock signal and the fourth clock signal; measure the phase difference between the third reference clock signal and the fourth clock signal; and convert the measured phase difference into a digital signal for outputting.

With reference to the first aspect of the present invention, in a first possible implementation manner of the first aspect, the fourth clock signal is a clock signal output by an oscillator to the time-to-digital converter.

With reference to the first aspect of the present invention or the first possible implementation manner of the first aspect, in a second possible implementation manner of the first aspect, the time-to-digital conversion circuit includes: a first delay link, a second delay link, and M triggers, where M is an integer greater than or equal to 2;

a clock input end of the first trigger in the M triggers is configured to input the third reference clock signal, and a data input end of the first trigger is configured to input the fourth clock signal;

the first delay link includes N stages of first delay units connected in series, where $N=M-1$; an input end of the first-stage first delay unit is configured to input the third reference clock signal; and an output end of the $x^{th}$-stage first delay unit is connected to a clock input end of the $(x+1)^{th}$ trigger in the M triggers, and is configured to input, to the clock input end of the $(x+1)^{th}$ trigger, a third reference clock signal obtained after being delayed by x stages of first delay units, where x is an integer greater than zero and less than or equal to N;

the second delay link includes N stages of second delay units connected in series, where an input end of the first-stage second delay unit is configured to input the fourth clock signal; and an output end of the $x^{th}$-stage second delay unit is connected to a data input end of the $(x+1)^{th}$ trigger, and is configured to input, to the clock input end of the $(x+1)^{th}$ trigger, a fourth clock signal obtained after being delayed by x stages of second delay units, where a time for which the first delay unit delays is greater than a time for which the second delay unit delays; and output ends of the M triggers are configured to output the digital signal.

With reference to the first aspect of the present invention, or the first or second possible implementation manner of the first aspect, in a third possible implementation manner of the first aspect, the phase interpolation circuit includes a first differential circuit and a second differential circuit;

the first differential circuit includes a first field-effect transistor, a second field-effect transistor, and a first tail current source, where a source end of the first field-effect transistor and a source end of the second field-effect transistor each are connected to an output end of the first tail current source, a control end of the first tail current source is configured to input a first control signal, the first control signal is used to adjust a current output by the first tail current source, a gate end of the first field-effect transistor is configured to input the first reference clock signal, and a gate end of the second field-effect transistor is configured to input a phase inversion signal of the first reference clock signal;

the second differential circuit includes a third field-effect transistor, a fourth field-effect transistor, and a second tail current source, where a source end of the third field-effect transistor and a source end of the fourth field-effect transistor each are connected to an output end of the second tail current source, a control end of the second tail current source is configured to input a second control signal, the second control signal is used to adjust a current output by the second tail current source, a gate end of the third field-effect transistor is configured to input the second reference clock signal, and a gate end of the fourth field-effect transistor is configured to input a phase inversion signal of the second reference clock signal;

a drain end of the first field-effect transistor is connected to a drain end of the third field-effect transistor, and the drain end of the first field-effect transistor and the drain end of the third field-effect transistor each are connected to a voltage source by using a first load; and a drain end of the second field-effect transistor is connected to a drain end of the fourth field-effect transistor, and the drain end of the second field-effect transistor and the drain end of the fourth field-effect transistor each are connected to the voltage source by using a second load, where a first connection end of the first load and a second connection end of the second load are configured to output the third reference clock signal, the first connection end is connected to the drain end of the first field-effect transistor and the drain end of the third field-effect transistor, and the second connection end is connected to the drain end of the second field-effect transistor and the drain end of the fourth field-effect transistor.

With reference to the third possible implementation manner of the first aspect of the present invention, in a fourth possible implementation manner of the first aspect, a phase difference between the first reference clock signal and the second reference clock signal is greater than or equal to a periodic time of the fourth clock signal.

With reference to the first aspect of the present invention, or any one of the first to third possible implementation manners of the first aspect, in a fifth possible implementation manner of the first aspect, the phase interpolation circuit is configured to receive Y reference clock signals of different phases, where the Y reference clock signals of different phases include the first reference clock signal and the second reference clock signal, and Y is an integer greater than or equal to 2; and the phase interpolation circuit includes Y differential circuits, where each differential circuit includes a first field-effect transistor, a second field-effect transistor, and a tail current source, where a source end of the first field-effect transistor and a source end of the second field-effect transistor each are connected to an output end of the tail current source; a control end of the tail current source is configured to input a control signal, where the control signal is used to adjust a current output by the tail current source; a gate end of the first field-effect transistor is configured to input one reference clock signal in the Y reference clock signals of different phases; a gate end of the second field-effect transistor is configured to input a phase inversion signal of the one reference clock signal; a drain end of the first field-effect transistor in each differential circuit is connected to the first connection end of the first load and is connected to the voltage source by using the first load; a drain end of the second field-effect transistor in each differential circuit is connected to the second connection end of the second load and is connected to the voltage source by using the second load; and there is a phase difference between reference clock signals input by the gate ends of the first field-effect transistors of the differential circuits;

at a same moment, tail current sources only in a differential circuit receiving the first reference clock signal and a differential circuit receiving the second reference clock signal in the Y differential circuits are switched on; and the first connection end of the first load and the second connection end of the second load are configured to output the third reference clock signal.

With reference to the fifth possible implementation manner of the first aspect of the present invention, in a sixth possible implementation manner of the first aspect, a phase difference between two reference clock signals having a maximum phase difference in the Y reference clock signals of different phases is greater than or equal to a periodic time of the fourth clock signal.

With reference to the fifth or sixth possible implementation manner of the first aspect of the present invention, in a seventh possible implementation manner of the first aspect, phase differences between reference clock signals input by gate ends of first field-effect transistors of adjacent differential circuits are equal.

With reference to any one of the third to sixth possible implementation manners of the first aspect of the present invention, in an eighth possible implementation manner of the first aspect, at a same moment, tail current sources in only one pair of adjacent differential circuits in the Y differential circuits are switched on.

With reference to the first aspect of the present invention, or the first or second possible implementation manner of the first aspect, in a ninth possible implementation manner of the first aspect, the phase interpolation circuit includes: a delay network unit consisting of a phase inverter, and a selecting unit, where the delay network unit is configured to obtain the first reference clock signal and the second reference clock signal, delay the first reference clock signal and the second reference clock signal, and output multiple delayed clock signals to the selecting unit; and the selecting unit is configured to select one clock signal from the multiple delayed clock signals as the third reference clock signal.

A second aspect of the present invention provides an all digital phase locked loop circuit, including: the time-to-digital converter described above, a digital control system, and an oscillator that are connected sequentially, where the oscillator outputs a clock signal to the time-to-digital converter.

With reference to the second aspect of the present invention, in a first possible implementation manner of the second aspect, a phase interpolation circuit in the time-to-digital converter includes a first differential circuit and a second differential circuit;

the first differential circuit includes a first field-effect transistor, a second field-effect transistor, and a first tail current source, where a source end of the first field-effect transistor and a source end of the second field-effect transistor each are connected to an output end of the first tail current source, a control end of the first tail current source is configured to input a first control signal, the first control signal is used to adjust a current output by the first tail current source, a gate end of the first field-effect transistor is configured to input the first reference clock signal, and a gate end of the second field-effect transistor is configured to input a phase inversion signal of the first reference clock signal;

the second differential circuit includes a third field-effect transistor, a fourth field-effect transistor, and a second tail current source, where a source end of the third field-effect transistor and a source end of the fourth field-effect transistor each are connected to an output end of the second tail current source, a control end of the second tail current source is configured to input a second control signal, the second control signal is used to adjust a current output by the second tail current source, a gate end of the third field-effect transistor is configured to input the second reference clock signal, and a gate end of the fourth field-effect transistor is configured to input a phase inversion signal of the second reference clock signal;

a drain end of the first field-effect transistor is connected to a drain end of the third field-effect transistor, and the drain end of the first field-effect transistor and the drain end of the third field-effect transistor each are connected to a voltage source by using the first load;

a drain end of the second field-effect transistor is connected to a drain end of the fourth field-effect transistor, and the drain end of the second field-effect transistor and the drain end of the fourth field-effect transistor each are connected to the voltage source by using the second load, where a first connection end of the first load and a second connection end of the second load are configured to output the third reference clock signal, the first connection end is connected to the drain end of the first field-effect transistor and the drain end of the third field-effect transistor, and the second connection end is connected to the drain end of the second field-effect transistor and the drain end of the fourth field-effect transistor; and the digital control system is configured to input the first control signal and the second control signal to the phase interpolation circuit.

With reference to the first possible implementation manner of the second aspect of the present invention, in a second possible implementation manner of the second aspect, a phase difference between the first reference clock signal and the second reference clock signal is greater than or equal to a periodic time of the fourth clock signal.

With reference to the first possible implementation manner of the second aspect of the present invention, in a third possible implementation manner of the second aspect, the phase interpolation circuit is configured to receive Y reference clock signals of different phases, where the Y reference clock signals of different phases include the first reference clock signal and the second reference clock signal, and Y is an integer greater than or equal to 2; and the phase interpolation circuit includes Y differential circuits, where each differential circuit includes a first field-effect transistor, a second field-effect transistor, and a tail current source, where a source end of the first field-effect transistor and a source end of the second field-effect transistor each are connected to an output end of the tail current source; a control end of the tail current source is configured to input a control signal, where the control signal is used to adjust a current output by the tail current source; a gate end of the first field-effect transistor is configured to input one reference clock signal in the Y reference clock signals of different phases; a gate end of the second field-effect transistor is configured to input a phase inversion signal of the one reference clock signal; a drain end of the first field-effect transistor in each differential circuit is connected to a first connection end of a first load and is connected to the voltage source by using the first load; a drain end of the second field-effect transistor in each differential circuit is connected to a second connection end of a second load and is connected to the voltage source by using the second load; and there is a phase difference between reference clock signals input by the gate ends of the first field-effect transistors of the differential circuits;

at a same moment, tail current sources only in a differential circuit receiving the first reference clock signal and a differential circuit receiving the second reference clock signal in the Y differential circuits are switched on;

the first connection end of the first load and the second connection end of the second load are configured to output the third reference clock signal; and the digital control system is configured to input the control signal to each differential circuit.

With reference to the third possible implementation manner of the second aspect of the present invention, in a fourth possible implementation manner of the second aspect, a phase difference between two reference clock signals having a maximum phase difference in the Y reference clock signals of different phases is greater than or equal to a periodic time of the fourth clock signal.

With reference to the third or fourth possible implementation manner of the second aspect of the present invention, in a fifth possible implementation manner of the second aspect, phase differences between reference clock signals input by gate ends of first field-effect transistors of adjacent differential circuits are equal.

With reference to any one of the third to fifth possible implementation manners of the second aspect of the present invention, in a sixth possible implementation manner of the second aspect, at a same moment, tail current sources in only one pair of adjacent differential circuits in the Y differential circuits are switched on.

With reference to the second aspect of the present invention, in a seventh possible implementation manner of the second aspect, the phase interpolation circuit includes: a delay network unit consisting of a phase inverter, and a selecting unit, where the delay network unit is configured to input a first reference clock signal and a second reference clock signal, delay the first reference clock signal and the second reference clock signal, and output multiple delayed clock signals to the selecting unit; and the selecting unit is configured to select one clock signal from the multiple delayed clock signals as a third reference clock signal.

A third aspect of the present invention provides a time-to-digital conversion method, including: receiving, by a time-to-digital converter, a first reference clock signal and a second reference clock signal, where a phase of the first reference clock signal is prior to a phase of the second reference clock signal; and performing phase interpolation on the first reference clock signal and the second reference clock signal to generate a third reference clock signal; and receiving, by the time-to-digital converter, a fourth clock signal, where a phase difference between the third reference clock signal and the fourth clock signal is less than a phase difference between the first reference clock signal and the fourth clock signal; measuring the phase difference between the third reference clock signal and the fourth clock signal; and converting the measured phase difference into a digital signal for outputting.

With reference to the third aspect of the present invention, in a first possible implementation manner of the third aspect, the fourth clock signal is a clock signal output by an oscillator to the time-to-digital converter.

With reference to the third aspect of the present invention or the first possible implementation manner of the third aspect, in a second possible implementation manner of the third aspect, a phase difference between the first reference clock signal and the second reference clock signal is greater than or equal to a periodic time of the fourth clock signal.

The time-to-digital converter provided in the present invention first performs phase interpolation on a first reference clock signal and a second reference clock signal to obtain a third reference clock signal, then measures a phase difference between the third reference clock signal and the fourth clock signal, and converts the measured phase difference into a digital signal for outputting. Because a phase difference between the third reference clock signal and the fourth clock signal is less than a phase difference between the fourth clock signal and the first reference clock signal, that is, a phase difference that a time-to-digital conversion circuit needs to convert is small, with the time-to-digital converter, time accuracy can be ensured and the number of delay units used in the time-to-digital conversion circuit can be reduced. In addition, a scale of a phase interpolation circuit is less than that of a delay link in the time-to-digital conversion circuit, and the circuit is simpler; thFREFore, with the time-to-digital converter provided in the present invention, a circuit scale is also reduced, thereby reducing power consumption of a circuit and a cost of a device.

DESCRIPTION OF EMBODIMENTS

The present invention is introduced in the following by describing embodiments.

Figure 1:
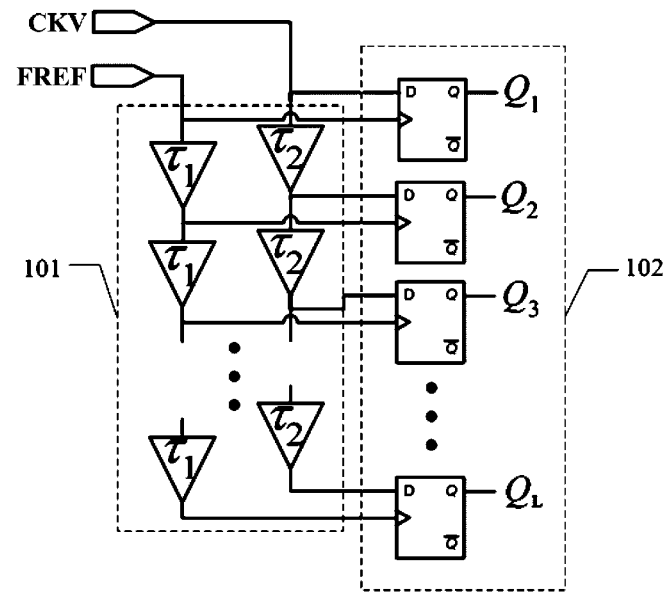
FIG. 1 is a schematic structural diagram of a circuit of an existing time-to-digital converter.
Figure 2:
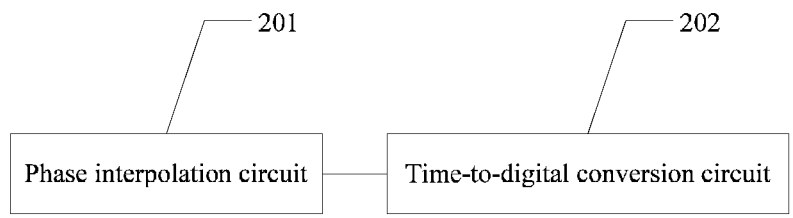
FIG. 2 is a schematic structural diagram of a time-to-digital converter according to the present invention.

As shown in FIG. 2, an embodiment of the present invention provides a time-to-digital converter. The time-to-digital converter is applicable to an all digital phase locked loop circuit, and the time-to-digital converter includes: a phase interpolation circuit 201 and a time-to-digital conversion circuit 202 connected to the phase interpolation circuit 201.

The phase interpolation circuit 201 is configured to receive a first reference clock signal and a second reference clock signal, where a phase of the first reference clock signal is prior to a phase of the second reference clock signal; perform phase interpolation on the first reference clock signal and the second reference clock signal to generate a third reference clock signal; and output the third reference clock signal to the time-to-digital conversion circuit 202.

The time-to-digital conversion circuit 202 is configured to receive the third reference clock signal and a fourth clock signal, where a phase difference between the third reference clock signal and the fourth clock signal is less than a phase difference between the first reference clock signal and the fourth clock signal; measure the phase difference between the third reference clock signal and the fourth clock signal; and convert the measured phase difference into a digital signal for outputting.

Figure 3:
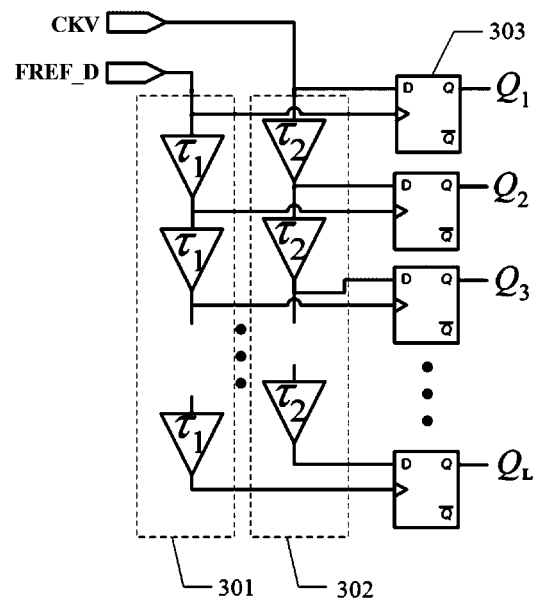
FIG. 3 is a schematic structural diagram of a time-to-digital conversion circuit in a time-to-digital converter according to the present invention.

In this embodiment, as shown in FIG. 3, the time-to-digital conversion circuit may include: a first delay link 301, a second delay link 302, and M triggers 303, where M is an integer greater than or equal to 2. A clock input end of the first trigger in the M triggers is configured to input the third reference clock signal, and a data input end of the first trigger is configured to input the fourth clock signal. The first delay link 301 includes N stages of first delay units connected in series, where N=M−1; an input end of the first-stage first delay unit is configured to input the third reference clock signal; and an output end of the $x^{th}$-stage first delay unit is connected to a clock input end of the $(x+1)^{th}$ trigger in the M triggers, and is configured to input, to the clock input end of the $(x+1)^{th}$ trigger, a third reference clock signal obtained after being delayed by x stages of first delay units, where x is an integer greater than zero and less than or equal to N. The second delay link 302 includes N stages of second delay units connected in series, where an input end of the first-stage second delay unit is configured to input the fourth clock signal; and an output end of the $x^{th}$-stage second delay unit is connected to a data input end of the $(x+1)^{th}$ trigger, and is configured to input, to the clock input end of the $(x+1)^{th}$ trigger, a fourth clock signal obtained after being delayed by x stages of second delay units, where a time for which the first delay unit delays is greater than a time for which the second delay unit delays; and output ends of the M triggers 303 are configured to output the digital signal.

For example, the first reference clock signal and the second reference clock signal that are received by the phase interpolation circuit may be two reference clock signals of different phases, where the two reference clock signals of different phases are generated by a multiphase clock signal generating circuit; and the fourth clock signal received by the time-to-digital conversion circuit may be a clock signal output by an oscillator in a phase locked loop circuit to the time-to-digital converter, and specifically may be a clock signal CKV. The first reference clock signal is a reference clock signal FREFA, and the second reference clock signal is a reference clock signal FREFB. The third reference clock signal obtained by performing interpolation on the reference clock signal FREFA and the reference clock signal FREFB may be represented as FREF_D. A phase of the reference clock signal FREF_D is between a phase of the reference clock signal FREFA and a phase of the reference clock signal FREFB, and a phase difference between the reference clock signal FREF_D and the clock signal CKV that is received by the time-to-digital conversion circuit is less than a phase difference between the reference clock signal FREFA and the clock signal CKV. As shown in FIG. 3, the time-to-digital conversion circuit receives the reference clock signal FREF_D and the clock signal CKV. The reference clock signal FREF_D is delayed by $\tau_1$ each time the reference clock signal FREF_D passes through one first delay unit in the first delay link, and the clock signal CKV is delayed by $\tau_2$ each time the clock signal CKV passes through one second delay unit in the second delay link, where $\tau_1$ is greater than $\tau_2$. Each time the reference clock signal FREF_D and the clock signal CKV pass through one delay unit, a time difference between the two increases by $T_R$, where $T_R=(\tau_1-\tau_2)$, and the time difference $T_R$ is time accuracy. After the reference clock signal FREF_D passes through N stages of first delay units, and the clock signal CKV passes through N stages of second delay units, an output sequence Q changes from 1 to 0, where the sequence $Q=[Q_1, Q_2, Q_3, \ldots, Q_L]$, and it indicates that a measurement time difference between a rising edge of the reference clock signal FREF_D and a rising edge of the clock signal CKV is $N \cdot T_R$. Because the phase difference between the reference clock signal FREF_D and the clock signal CKV is relatively small, with the time-to-digital converter provided in this embodiment, the number of stages of first delay units in the first delay link and the number of stages of second delay units in the second delay link can be reduced on the premise that $T_R$ is unchanged.

Figure 4:
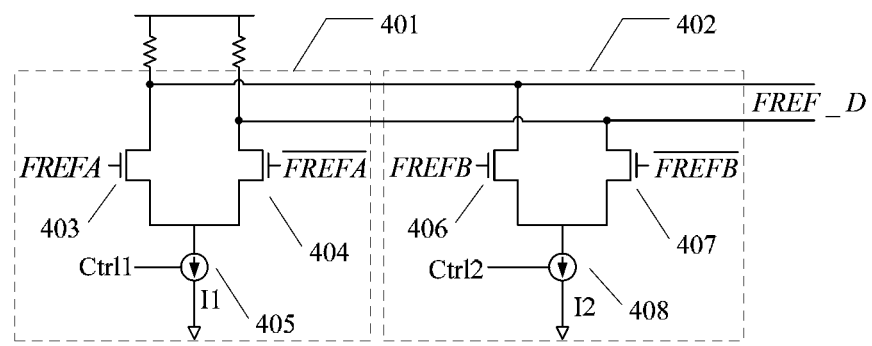
FIG. 4 is a schematic structural diagram of a phase interpolation circuit in a time-to-digital converter according to the present invention.

In the foregoing embodiment, as shown in FIG. 4, the phase interpolation circuit may include a first differential circuit 401 and a second differential circuit 402. The first differential circuit 401 includes a first field-effect transistor 403, a second field-effect transistor 404, and a first tail current source 405, where a source end of the first field-effect transistor 403 and a source end of the second field-effect transistor 404 each are connected to an output end of the first tail current source 405, a control end of the first tail current source 405 is configured to input a first control signal, where the first control signal is used to adjust a current I1 output by the first tail current source 405, and in FIG. 4, the first control signal is represented as Ctrl1. A gate end of the first field-effect transistor 403 is configured to input the first reference clock signal, and a gate end of the second field-effect transistor 404 is configured to input a phase inversion signal of the first reference clock signal, where in FIG. 4, the first reference clock signal is a reference clock signal FREFA, and the phase inversion signal of the first reference clock signal is represented as $\overline{\text{FREFA}}$. The second differential circuit 402 includes a third field-effect transistor 406, a fourth field-effect transistor 407, and a second tail current source 408, where a source end of the third field-effect transistor 406 and a source end of the fourth field-effect transistor 407 each are connected to an output end of the second tail current source 408, a control end of the second tail current source 408 is configured to input a second control signal, where the second control signal is used to adjust a current I2 output by the second tail current source 408, and in FIG. 4, the second control signal is represented as Ctrl2. A gate end of the third field-effect transistor 406 is configured to input the second reference clock signal, and a gate end of the fourth field-effect transistor 407 is configured to input a phase inversion signal of the second reference clock signal. A phase difference between the first reference clock signal and the second reference clock signal is greater than or equal to a periodic time of the fourth clock signal. In FIG. 4, the second reference clock signal is a reference clock signal FREFB, and the phase inversion signal of the second reference clock signal is represented as $\overline{\text{FREFB}}$. A drain end of the first field-effect transistor 403 is connected to a drain end of the third field-effect transistor 406, and the drain end of the first field-effect transistor 403 and the drain end of the third field-effect transistor 406 each are connected to a voltage source by using a first load. A drain end of the second field-effect transistor 404 is connected to a drain end of the fourth field-effect transistor 407, and the drain end of the second field-effect transistor 404 and the drain end of the fourth field-effect transistor 407 each are connected to the voltage source by using a second load. A first connection end of the first load and a second connection end of the second load are configured to output the third reference clock signal, the first connection end is connected to the drain end of the first field-effect transistor 403 and the drain end of the third field-effect transistor 406, and the second connection end is connected to the drain end of the second field-effect transistor 404 and the drain end of the fourth field-effect transistor 407.

Referring to FIG. 2 to FIG. 4, the following further describes the present invention with reference to the phase interpolation circuit and the time-to-digital conversion circuit in the foregoing embodiment.

Specifically, assuming that a phase difference between the FREFA and the FREFB is represented as ph_delta, ph_delta is greater than or equal to a period of the fourth clock signal CKV, and a phase of the FREFA is prior to a phase of the FREFB. The third reference clock signal FREF_D whose phase is between the phase of the FREFA and the phase of the FREFB may be obtained by adjusting the control signals Ctrl1 and Ctrl2 that are input to the phase interpolation circuit. Assuming that ph_delta is evenly divided into Z parts, a phase difference phx between the FREF_D and the FREFA may be represented as $$phx = \frac{k}{Z}\text{ph\_delta},$$

where k is determined by a proportion of the current output by the first tail current source in the first differential circuit to the current output by the second tail current source in the second differential circuit, Z is determined by a sum of the two, both k and Z are integers greater than 0, and k is less than or equal to Z.

In the phase locked loop circuit, to obtain a time difference between the FREFA and the CKV, the first control signal is used to adjust the current output by the first tail current source, and the second control signal is used to adjust the current output by the second tail current source, so that the phase difference between the CKV and the FREF_D is less than $$\frac{1}{Z}\text{ph\_delta}.$$

In this case, the time-to-digital conversion circuit only needs to measure the phase difference $$\frac{1}{Z}\text{ph\_delta},$$

and the number N stages of delay units in each delay link in the time-to-digital conversion circuit only needs to satisfy $$N \geq \frac{\text{ph\_delta}}{Z \cdot T_R}.$$

After the FREF_D is delayed by N stages of first delay units, and the CKV is delayed by N stages of second delay units, the output sequence Q changes from 1 to 0, and the measurement time difference between the rising edge of the FREF_D and the rising edge of the CKV is $N \cdot T_R$. ThFREFore, a measurement time difference between a rising edge of the FREFA and a rising edge of the CKV is a sum of phx and $N \cdot T_R$. Because $$\frac{1}{Z}\text{ph\_delta}$$

is less than the phase difference between the FREFA and the CKV, with the time-to-digital converter, the number of stages of delay units in the time-to-digital conversion circuit can be reduced on the premise that time accuracy $T_R$ is not reduced. A scale of the phase interpolation circuit is less than that of a delay link in the time-to-digital conversion circuit, a circuit is simpler; thFREFore, with the time-to-digital converter provided in the present invention, a circuit scale of the time-to-digital converter is also reduced, thereby reducing power consumption of the time-to-digital converter and a cost of a device. In addition, the FREF_D output by the phase interpolation circuit in this embodiment is controlled by a proportion of tail currents of two differential circuits, and is affected by factors of a technique, a voltage, and a temperature to the slightest extent; thFREFore, circuit reliability is improved. Because a phase of a signal output by the phase interpolation circuit is determined, digital implementation is facilitated, and algorithm complexity is greatly reduced. Moreover, because a working frequency of the phase interpolation circuit is a reference clock frequency, and the reference clock frequency is relatively small, power consumption of the circuit is further reduced.

In the foregoing embodiment, the phase interpolation circuit may also be another kind of circuit, and the phase interpolation circuit is configured to receive Y reference clock signals of different phases, where the Y reference clock signals of different phases include the first reference clock signal and the second reference clock signal, and Y is an integer greater than or equal to 2. The phase interpolation circuit includes Y differential circuits, and each differential circuit includes a first field-effect transistor, a second field-effect transistor, and a tail current source. A source end of the first field-effect transistor and a source end of the second field-effect transistor each are connected to an output end of the tail current source; a control end of the tail current source is configured to input a control signal, where the control signal is used to adjust a current output by the tail current source; a gate end of the first field-effect transistor is configured to input one reference clock signal in the Y reference clock signals of different phases; a gate end of the second field-effect transistor is configured to input a phase inversion signal of the one reference clock signal; a drain end of the first field-effect transistor in each differential circuit is connected to the first connection end of the first load and is connected to the voltage source by using the first load; a drain end of the second field-effect transistor in each differential circuit is connected to the second connection end of the second load and is connected to the voltage source by using the second load; and there is a phase difference between reference clock signals input by the gate ends of the first field-effect transistors of the differential circuits. At a same moment, tail current sources only in a differential circuit receiving the first reference clock signal and a differential circuit receiving the second reference clock signal in the Y differential circuits are switched on. The first connection end of the first load and the second connection end of the second load are configured to output the third reference clock signal.

In this embodiment of the present invention, phase differences between reference clock signals input by gate ends of first field-effect transistors of adjacent differential circuits are equal, so that a differential circuit needing to run is selected, so as to generate a needed FREF_D. For example, the phase difference between the reference clock signal FREFA input by the first differential circuit 401 and the reference clock signal FREFB input by the second differential circuit 402 is referred to as a first phase difference, and a phase difference between the reference clock signal FREFB input by the second differential circuit 402 and a reference clock signal FREFC input by a third differential circuit 409 is referred to as a second phase difference, where the first phase difference is equal to the second phase difference. A phase difference between two reference clock signals having a maximum phase difference in the Y reference clock signals of different phases is greater than or equal to a periodic time of the fourth clock signal that is input to the time-to-digital conversion circuit.

Figure 5:
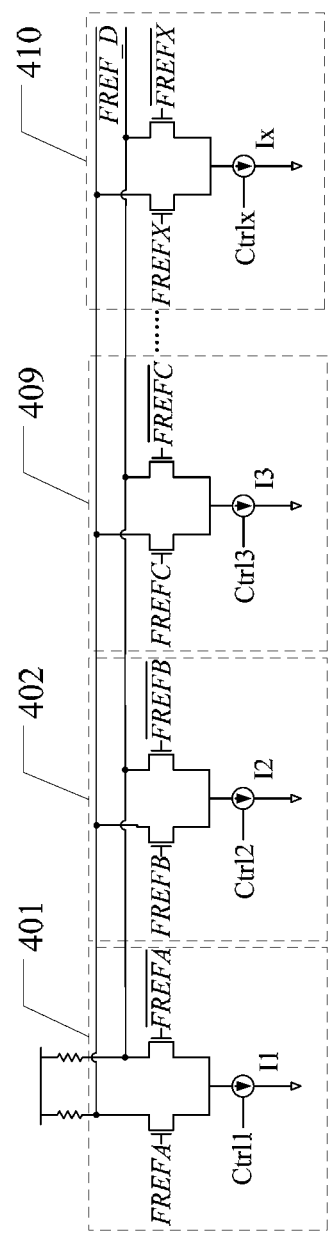
FIG. 5 is a schematic structural diagram of another phase interpolation circuit in a time-to-digital converter according to the present invention.

As shown in FIG. 5, the phase interpolation circuit includes X differential circuits, such as the first differential circuit 401, the second differential circuit 402, the third differential circuit 409, and an $X^{th}$ differential circuit 410, where X is an integer greater than 1. In the X differential circuits, phase differences between reference clock signals input by gate ends of first field-effect transistors of adjacent differential circuits are equal. The number of phases of a reference clock signal is X, and the reference clock signals are marked as FREFA/FREFB/FREFC . . . FREFX in ascending order of phases; and then a phase difference ph_delta*(X−1) between the FREFA and the FREFX should be greater than or equal to one period of a CKV, that is, $(X-1)\square ph\_delta \geq T_{ckv}$.

Reference clock signals input to the first differential circuit 401 are an FREFA and an $\overline{FREFA}$, where the $\overline{FREFA}$ is a phase inversion signal of the FREFA, and a control signal input to the first differential circuit 401 is represented as Ctrl1;

reference clock signals input to the second differential circuit 402 are an FREFB and an $\overline{FREFB}$, where the $\overline{FREFB}$ is a phase inversion signal of the FREFB, and a control signal input to the second differential circuit 402 is represented as Ctrl2;

reference clock signals input to the third differential circuit 409 are an FREFC and an $\overline{FREFC}$, where the $\overline{FREFC}$ is a phase inversion signal of the FREFC, and a control signal input to the third differential circuit 409 is represented as Ctrl3; and reference clock signals input to the $X^{th}$ differential circuit 410 are an FREFX and an $\overline{FREFX}$, where the $\overline{FREFX}$ is a phase inversion signal of the FREFX, and a control signal input to the $X^{th}$ differential circuit 401 is represented as Ctrlx.

However, at a same moment, only two differential circuits in the X differential circuits work, and the other differential circuits stop running. Running of the differential circuits may be controlled by using control signals Ctrl1, Ctrl2, Ctrl3 . . . Ctrlx. For example, when the control signals Ctrl3 . . . Ctrlx control tail current sources of the third differential circuit 409 to the $X^{th}$ differential circuit 410 to stop outputting currents I3 . . . Ix, and the control signals Ctrl1 and Ctrl2 control tail current sources of the first differential circuit 401 and the second differential circuit 402 respectively to output currents I1 and I2, the third differential circuit 409 to the $X^{th}$ differential circuit 410 stop running, and only the first differential circuit 401 and the second differential circuit 402 run.

Preferably, at a same moment, tail current sources in only one pair of adjacent differential circuits in the Y differential circuits output a current. For example, the tail current sources in only the first differential circuit 401 and the second differential circuit 402 output a current, and tail current sources of the other differential circuits stop outputting a current and stop running.

Figure 6:
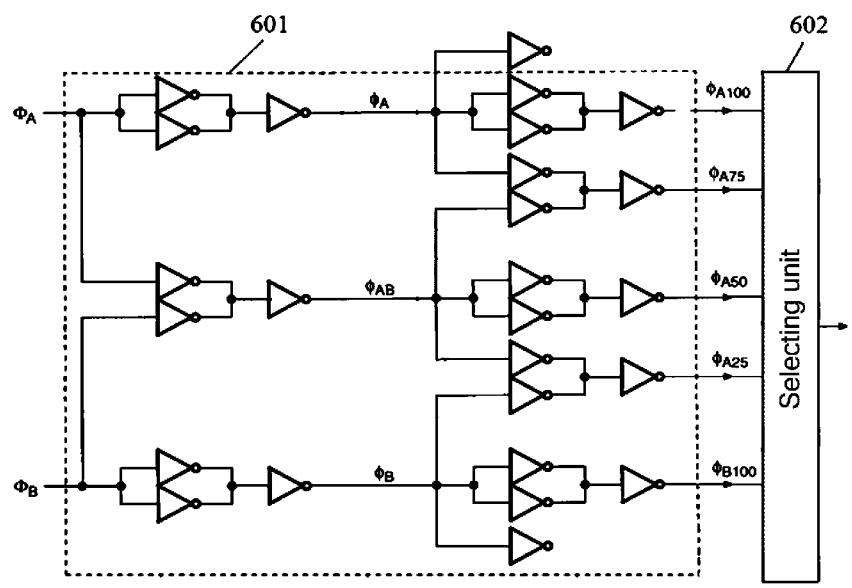
FIG. 6 is a schematic structural diagram of still another phase interpolation circuit in a time-to-digital converter according to the present invention.

In the foregoing embodiment, as shown in FIG. 6, the phase interpolation circuit may also be another kind of circuit. The phase interpolation circuit includes: a delay network unit 601 including a phase inverter, and a selecting unit 602, where the delay network unit 601 is configured to obtain the first reference clock signal and the second reference clock signal, and is configured to delay the first reference clock signal and the second reference clock signal, and output multiple delayed clock signals to the selecting unit 602; and the selecting unit 602 is configured to select one clock signal from the multiple delayed clock signals as the third reference clock signal. In FIG. 6, the delay network unit 601 inputs two adjacent items, such as an FREFA and an FREFB, in a multiphase clock signal, where phases of the FREFA and the FREFB are $\phi A$ and $\phi B$. After the FREFA and the FREFB pass through different delay channels of the delay network unit 601 separately or in a combined manner, a series of signals, such as $\phi_{A100}$, $\phi_{A75}$, $\phi_{A50}$, $\phi_{A25}$, and $\phi_{B100}$, (phase differences sequentially differ from each other at a fixed value) having a fixed phase difference are output. The selecting unit 105 selects one signal from the series of signals as an output signal FREF_D according to a control signal CTR generated by a digital phase locked loop control system.

It should be noted that in the present invention, the phase interpolation circuit may also be a circuit of another type, and is not limited to the phase interpolation circuits listed above.

Figure 7:
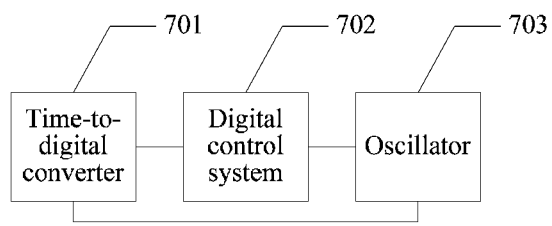
FIG. 7 is a schematic structural diagram of an all digital phase locked loop circuit according to the present invention.

As shown in FIG. 7, an embodiment of the present invention further provides an all digital phase locked loop circuit. The all digital phase locked loop circuit includes: a time-to-digital converter 701, a digital control system 702, and an oscillator 703 that are connected sequentially, where the oscillator 703 outputs a clock signal to the time-to-digital converter.

The time-to-digital converter 701 includes: a phase interpolation circuit and a time-to-digital conversion circuit connected to the phase interpolation circuit.

The phase interpolation circuit is configured to receive a first reference clock signal and a second reference clock signal, where a phase of the first reference clock signal is prior to a phase of the second reference clock signal; perform phase interpolation on the first reference clock signal and the second reference clock signal to generate a third reference clock signal, where a phase of the third reference clock signal is between the phase of the first reference clock signal and the phase of the second reference clock signal; and output the third reference clock signal to the time-to-digital conversion circuit.

The time-to-digital conversion circuit is configured to receive the third reference clock signal and a fourth clock signal, where a phase difference between the third reference clock signal and the fourth clock signal is less than a phase difference between the first reference clock signal and the fourth clock signal; measure the phase difference between the third reference clock signal and the fourth clock signal; and convert the measured phase difference into a digital signal for outputting.

Optionally, the fourth clock signal is a clock signal output by the oscillator to the time-to-digital converter 701.

Optionally, the time-to-digital conversion circuit includes: a first delay link, a second delay link, and M triggers, where M is an integer greater than or equal to 2.

A clock input end of the first trigger in the M triggers is configured to input the third reference clock signal, and a data input end of the first trigger is configured to input the fourth clock signal.

The first delay link includes N stages of first delay units connected in series, where N=M−1; an input end of the first-stage first delay unit is configured to input the third reference clock signal; an output end of the $x^{th}$-stage first delay unit is connected to a clock input end of the $(x+1)^{th}$ trigger in the M triggers, and is configured to input, to the clock input end of the $(x+1)^{th}$ trigger, a third reference clock signal obtained after being delayed by x stages of first delay units, where x is an integer greater than zero and less than or equal to N.

The second delay link includes N stages of second delay units connected in series, where an input end of the first-stage second delay unit is configured to input the fourth clock signal; and an output end of the $x^{th}$-stage second delay unit is connected to a data input end of the $(x+1)^{th}$ trigger, and is configured to input, to the data input end of the $(x+1)^{th}$ trigger, a fourth clock signal obtained after being delayed by x stages of second delay units, where a time for which the first delay unit delays is greater than a time for which the second delay unit delays; and output ends of the M triggers are configured to output the digital signal.

Optionally, the phase interpolation circuit in the time-to-digital converter 701 includes a first differential circuit and a second differential circuit.

The first differential circuit includes a first field-effect transistor, a second field-effect transistor, and a first tail current source, where a source end of the first field-effect transistor and a source end of the second field-effect transistor each are connected to an output end of the first tail current source, and a control end of the first tail current source is configured to input a first control signal, where the first control signal is used to adjust a current output by the first tail current source. A gate end of the first field-effect transistor is configured to input the first reference clock signal, and a gate end of the second field-effect transistor is configured to input a phase inversion signal of the first reference clock signal.

The second differential circuit includes a third field-effect transistor, a fourth field-effect transistor, and a second tail current source, where a source end of the third field-effect transistor and a source end of the fourth field-effect transistor each are connected to an output end of the second tail current source, and a control end of the second tail current source is configured to input a second control signal, where the second control signal is used to adjust a current output by the second tail current source. A gate end of the third field-effect transistor is configured to input the second reference clock signal, and a gate end of the fourth field-effect transistor is configured to input a phase inversion signal of the second reference clock signal.

A drain end of the first field-effect transistor is connected to a drain end of the third field-effect transistor, and the drain end of the first field-effect transistor and the drain end of the third field-effect transistor each are connected to a voltage source by using a first load.

A drain end of the second field-effect transistor is connected to a drain end of the fourth field-effect transistor, and the drain end of the second field-effect transistor and the drain end of the fourth field-effect transistor each are connected to the voltage source by using a second load.

A first connection end of the first load and a second connection end of the second load are configured to output the third reference clock signal, the first connection end is connected to the drain end of the first field-effect transistor and the drain end of the third field-effect transistor, and the second connection end is connected to the drain end of the second field-effect transistor and the drain end of the fourth field-effect transistor.

The digital control system is configured to input the first control signal and the second control signal to the phase interpolation circuit.

A phase difference between the first reference clock signal and the second reference clock signal is greater than or equal to a periodic time of the fourth clock signal.

Optionally, the phase interpolation circuit is configured to receive at least two clock signals, where the at least two clock signals include the first reference clock signal and the second reference clock signal.

Optionally, the phase interpolation circuit is configured to receive Y reference clock signals of different phases, where the Y reference clock signals of different phases include the first reference clock signal and the second reference clock signal, and Y is an integer greater than or equal to 2; and the phase interpolation circuit includes Y differential circuits, where each differential circuit includes a first field-effect transistor, a second field-effect transistor, and a tail current source, where a source end of the first field-effect transistor and a source end of the second field-effect transistor each are connected to an output end of the tail current source; a control end of the tail current source is configured to input a control signal, where the control signal is used to adjust a current output by the tail current source; a gate end of the first field-effect transistor is configured to input one reference clock signal in the at least two reference clock signals; a gate end of the second field-effect transistor is configured to input a phase inversion signal of the one reference clock signal; a drain end of the first field-effect transistor in each differential circuit is connected to the first connection end of the first load and is connected to the voltage source by using the first load; a drain end of the second field-effect transistor in each differential circuit is connected to the second connection end of the second load and is connected to the voltage source by using the second load; and there is a phase difference between reference clock signals input by the gate ends of the first field-effect transistors of the differential circuits;

at a same moment, tail current sources only in a differential circuit receiving the first reference clock signal and a differential circuit receiving the second reference clock signal in the Y differential circuits are switched on; and the first connection end of the first load and the second connection end of the second load are configured to output the third reference clock signal.

The digital control system is configured to input the control signals to the phase interpolation circuit in each differential circuit.

Optionally, phase differences between reference clock signals input by gate ends of first field-effect transistors of adjacent differential circuits are equal.

Optionally, at a same moment, tail current sources in only one pair of adjacent differential circuits in the Y differential circuits output a current.

Optionally, the phase interpolation circuit includes: a delay network unit consisting of a phase inverter, and a selecting unit, where the delay network unit is configured to input the first reference clock signal and the second reference clock signal, delay the first reference clock signal and the second reference clock signal, and output multiple delayed clock signals to the selecting unit; and the selecting unit is configured to select one clock signal from the multiple delayed clock signals as the third reference clock signal.

Figure 8:
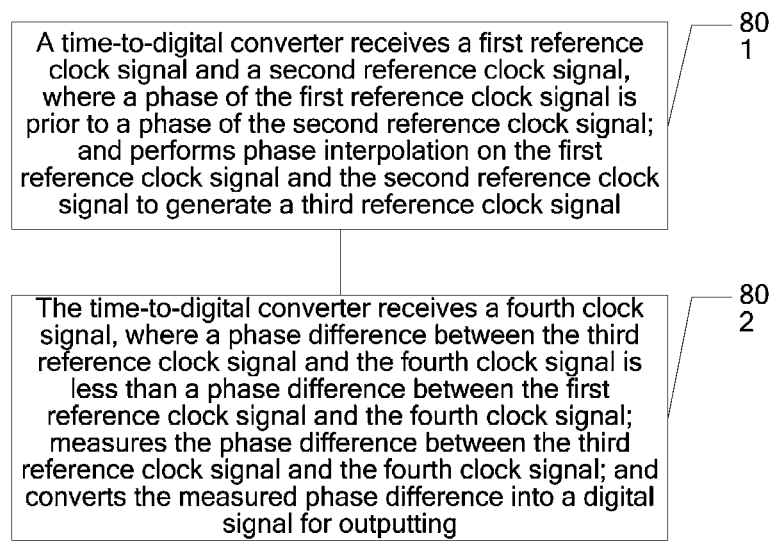
FIG. 8 is a schematic flowchart of a time-to-digital conversion method according to the present invention.

As shown in FIG. 8, an embodiment of the present invention further provides a time-to-digital conversion method, where the method is applicable to the time-to-digital converter provided in the present invention. The method may specifically include:

801: The time-to-digital converter receives a first reference clock signal and a second reference clock signal, where a phase of the first reference clock signal is prior to a phase of the second reference clock signal; and performs phase interpolation on the first reference clock signal and the second reference clock signal to generate a third reference clock signal.

802: The time-to-digital converter receives a fourth clock signal, where a phase difference between the third reference clock signal and the fourth clock signal is less than a phase difference between the first reference clock signal and the fourth clock signal; measures the phase difference between the third reference clock signal and the fourth clock signal; and converts the measured phase difference into a digital signal for outputting.

Optionally, the fourth clock signal is a clock signal output by an oscillator to the time-to-digital converter.

Optionally, a phase difference between the first reference clock signal and the second reference clock signal is greater than or equal to a periodic time of the fourth clock signal.

A person of ordinary skill in the art may understand that all or some of the steps of the methods in the foregoing embodiments may be implemented by a program instructing related hardware. The program may be stored in a computer-readable storage medium. The storage medium may include: a read-only memory (ROM), a random access memory (RAM), a magnetic disk, or an optical disc.

The time-digital converter, the all digital phase locked loop circuit, and the time-digital conversion method that are provided in the embodiments of the present invention are introduced in detail in the foregoing. Specific examples are used in this specification to describe the principle and implementation manners of the present invention. The descriptions of the foregoing embodiments are merely intended to help understand the method and core ideas of the present invention. In addition, a person skilled in the art may make modifications with respect to the specific implementation manners and the application scope according to the ideas of the present invention. ThFREFore, the content of this specification shall not be construed as a limitation on the present invention.

We claim:

1. A time-to-digital converter, comprising: a phase interpolation circuit and a time-to-digital conversion circuit connected to the phase interpolation circuit, wherein the phase interpolation circuit is configured to receive a first reference clock signal and a second reference clock signal, wherein a phase of the first reference clock signal is prior to a phase of the second reference clock signal; perform phase interpolation on the first reference clock signal and the second reference clock signal to generate a third reference clock signal; and output the third reference clock signal to the time-to-digital conversion circuit; and the time-to-digital conversion circuit is configured to receive the third reference clock signal and a fourth clock signal, wherein a phase difference between the third reference clock signal and the fourth clock signal is less than a phase difference between the first reference clock signal and the fourth clock signal; measure the phase difference between the third reference clock signal and the fourth clock signal; and convert the measured phase difference into a digital signal for outputting, wherein the time-to-digital conversion circuit comprises:

a first delay link, a second delay link, and M triggers, wherein M is an integer greater than or equal to 2;

a clock input end of a first trigger in the M triggers is configured to input the third reference clock signal, and a data input end of the first trigger is configured to input the fourth clock signal;

the first delay link comprises N stages of first delay units connected in series, wherein N=M−1; an input end of a first-stage first delay unit is configured to input the third reference clock signal; and an output end of an $x^{th}$-stage first delay unit is connected to a clock input end of the $(x+1)^{th}$ trigger in the M triggers, and is configured to input, to the clock input end of an $(x+1)^{th}$ trigger, a third reference clock signal obtained after being delayed by x stages of first delay units, wherein x is an integer greater than zero and less than or equal to N;

the second delay link comprises N stages of second delay units connected in series, wherein an input end of a first-stage second delay unit is configured to input the fourth clock signal; and an output end of an $x^{th}$-stage second delay unit is connected to a data input end of an $(x+1)^{th}$ trigger, and is configured to input, to the clock input end of the $(x+1)^{th}$ trigger, a fourth clock signal obtained after being delayed by x stages of second delay units, wherein a time for which the first delay unit delays is greater than a time for which the second delay unit delays; and output ends of the M triggers are configured to output the digital signal.

2. The time-to-digital converter according to claim 1, wherein the fourth clock signal is a clock signal output by an oscillator coupled to the time-to-digital converter.

3. The time-to-digital converter according to claim 1, wherein the phase interpolation circuit comprises a first differential circuit and a second differential circuit;

the first differential circuit comprises a first field-effect transistor, a second field-effect transistor, and a first tail current source, wherein a source end of the first field-effect transistor and a source end of the second field-effect transistor are each connected to an output end of the first tail current source, a control end of the first tail current source is configured to input a first control signal, the first control signal is used to adjust a current output by the first tail current source, a gate end of the first field-effect transistor is configured to input the first reference clock signal, and a gate end of the second field-effect transistor is configured to input a phase inversion signal of the first reference clock signal;

the second differential circuit comprises a third field-effect transistor, a fourth field-effect transistor, and a second tail current source, wherein a source end of the third field-effect transistor and a source end of the fourth field-effect transistor are each connected to an output end of the second tail current source, a control end of the second tail current source is configured to input a second control signal, the second control signal is used to adjust a current output by the second tail current source, a gate end of the third field-effect transistor is configured to input the second reference clock signal, and a gate end of the fourth field-effect transistor is configured to input a phase inversion signal of the second reference clock signal;

a drain end of the first field-effect transistor is connected to a drain end of the third field-effect transistor, and the drain end of the first field-effect transistor and the drain end of the third field-effect transistor each are connected to a voltage source by a first load; and a drain end of the second field-effect transistor is connected to a drain end of the fourth field-effect transistor, and the drain end of the second field-effect transistor and the drain end of the fourth field-effect transistor are each connected to the voltage source by using a second load, wherein a first connection end of the first load and a second connection end of the second load are configured to output the third reference clock signal, the first connection end is connected to the drain end of the first field-effect transistor and the drain end of the third field-effect transistor, and the second connection end is connected to the drain end of the second field-effect transistor and the drain end of the fourth field-effect transistor.

4. The time-to-digital converter according to claim 3, wherein a phase difference between the first reference clock signal and the second reference clock signal is greater than or equal to a periodic time of the fourth clock signal.

5. The time-to-digital converter according to claim 1, wherein the phase interpolation circuit is configured to receive Y reference clock signals of different phases, wherein the Y reference clock signals of different phases comprise the first reference clock signal and the second reference clock signal, and Y is an integer greater than or equal to 2; and the phase interpolation circuit comprises Y differential circuits, wherein each differential circuit comprises a first field-effect transistor, a second field-effect transistor, and a tail current source, wherein a source end of the first field-effect transistor and a source end of the second field-effect transistor are each connected to an output end of the tail current source; a control end of the tail current source is configured to input a control signal, wherein the control signal is used to adjust a current output by the tail current source;

a gate end of the first field-effect transistor is configured to input one reference clock signal in the Y reference clock signals of different phases; a gate end of the second field-effect transistor is configured to input a phase inversion signal of the one reference clock signal; a drain end of the first field-effect transistor in each differential circuit is connected to a first connection end of a first load and is connected to a voltage source by the first load; a drain end of the second field-effect transistor in each differential circuit is connected to a second connection end of a second load and is connected to the voltage source by the second load; and there is a phase difference between reference clock signals input by the gate ends of the first field-effect transistors of the differential circuits;

at a same moment, tail current sources only in a differential circuit receiving the first reference clock signal and a differential circuit receiving the second reference clock signal in the Y differential circuits are switched on; and the first connection end of the first load and the second connection end of the second load are configured to output the third reference clock signal.

6. The time-to-digital converter according to claim 5, wherein a phase difference between two reference clock signals having a maximum phase difference in the Y reference clock signals of different phases is greater than or equal to a periodic time of the fourth clock signal.

7. The time-to-digital converter according to claim 5, wherein phase differences between reference clock signals input by gate ends of first field-effect transistors of adjacent differential circuits are equal.

8. The time-to-digital converter according to claim 5, wherein at a same moment, tail current sources in only one pair of adjacent differential circuits in the Y differential circuits are switched on.

9. The time-to-digital converter according to claim 1, wherein the phase interpolation circuit comprises: a delay network unit including a phase inverter, and a selecting unit, wherein the delay network unit is configured to obtain the first reference clock signal and the second reference clock signal, delay the first reference clock signal and the second reference clock signal, and output multiple delayed clock signals to the selecting unit; and the selecting unit is configured to select one clock signal from the multiple delayed clock signals as the third reference clock signal.

10. An all digital phase locked loop circuit, comprising: the time-to-digital converter according to claim 1, a digital control system, and an oscillator that are connected sequentially, wherein the oscillator outputs a clock signal to the time-to-digital converter.

11. The all digital phase locked loop circuit according to claim 10, wherein a phase interpolation circuit in the time-to-digital converter comprises a first differential circuit and a second differential circuit;
the first differential circuit comprises a first field-effect transistor, a second field-effect transistor, and a first tail current source, wherein a source end of the first field-effect transistor and a source end of the second field-effect transistor are each connected to an output end of the first tail current source, a control end of the first tail current source is configured to input a first control signal, the first control signal is used to adjust a current output by the first tail current source, a gate end of the first field-effect transistor is configured to input the first reference clock signal, and a gate end of the second field-effect transistor is configured to input a phase inversion signal of the first reference clock signal;
the second differential circuit comprises a third field-effect transistor, a fourth field-effect transistor, and a second tail current source, wherein a source end of the third field-effect transistor and a source end of the fourth field-effect transistor are each connected to an output end of the second tail current source, a control end of the second tail current source is configured to input a second control signal, the second control signal is used to adjust a current output by the second tail current source, a gate end of the third field-effect transistor is configured to input the second reference clock signal, and a gate end of the fourth field-effect transistor is configured to input a phase inversion signal of the second reference clock signal;
a drain end of the first field-effect transistor is connected to a drain end of the third field-effect transistor, and the drain end of the first field-effect transistor and the drain end of the third field-effect transistor are each connected to a voltage source by a first load;
a drain end of the second field-effect transistor is connected to a drain end of the fourth field-effect transistor, and the drain end of the second field-effect transistor and the drain end of the fourth field-effect transistor are each connected to the voltage source by a second load, wherein
a first connection end of the first load and a second connection end of the second load are configured to output the third reference clock signal, the first connection end is connected to the drain end of the first field-effect transistor and the drain end of the third field-effect transistor, and the second connection end is connected to the drain end of the second field-effect transistor and the drain end of the fourth field-effect transistor; and
the digital control system is configured to input the first control signal and the second control signal to the phase interpolation circuit.

12. The all digital phase locked loop circuit according to claim 11, wherein a phase difference between the first reference clock signal and the second reference clock signal is greater than or equal to a periodic time of the fourth clock signal.

13. The all digital phase locked loop circuit according to claim 10, wherein the phase interpolation circuit is configured to receive Y reference clock signals of different phases, wherein the Y reference clock signals of different phases comprise the first reference clock signal and the second reference clock signal, and Y is an integer greater than or equal to 2; and
the phase interpolation circuit comprises Y differential circuits, wherein
each differential circuit comprises a first field-effect transistor, a second field-effect transistor, and a tail current source, wherein a source end of the first field-effect transistor and a source end of the second field-effect transistor are each connected to an output end of the tail current source; a control end of the tail current source is configured to input a control signal, wherein the control signal is used to adjust a current output by the tail current source; a gate end of the first field-effect transistor is configured to input one reference clock signal in the Y reference clock signals of different phases; a gate end of the second field-effect transistor is configured to input a phase inversion signal of the one reference clock signal; a drain end of the first field-effect transistor in each differential circuit is connected to a first connection end of a first load and is connected to the voltage source by using the first load; a drain end of the second field-effect transistor in each differential circuit is connected to a second connection end of a second load and is connected to the voltage source by the second load; and there is a phase difference between reference clock signals input by the gate ends of the first field-effect transistors of the differential circuits;
at a same moment, tail current sources only in a differential circuit receiving the first reference clock signal and a differential circuit receiving the second reference clock signal in the Y differential circuits are switched on;
the first connection end of the first load and the second connection end of the second load are configured to output the third reference clock signal; and
the digital control system is configured to input the control signal to each differential circuit.

14. The all digital phase locked loop circuit according to claim 13, wherein a phase difference between two reference clock signals having a maximum phase difference in the Y reference clock signals of different phases is greater than or equal to a periodic time of the fourth clock signal.

15. The all digital phase locked loop circuit according to claim 13, wherein phase differences between reference clock signals input by gate ends of first field-effect transistors of adjacent differential circuits are equal.

16. The all digital phase locked loop circuit according to claim 13, wherein at a same moment, tail current sources in only one pair of adjacent differential circuits in the Y differential circuits are switched on.

17. The all digital phase locked loop circuit according to claim 10, wherein the phase interpolation circuit comprises: a delay network unit including a phase inverter, and a selecting unit, wherein the delay network unit is configured to input a first reference clock signal and a second reference clock signal, delay the first reference clock signal and the second reference clock signal, and output multiple delayed clock signals to the selecting unit; and the selecting unit is configured to select one clock signal from the multiple delayed clock signals as a third reference clock signal.

* * * * *